US006581817B2

(12) United States Patent
Kawashima et al.

(10) Patent No.: US 6,581,817 B2
(45) Date of Patent: Jun. 24, 2003

(54) DIE BONDING DEVICE

(75) Inventors: Yoshiyuki Kawashima, Tokyo (JP); Hiroshi Nitta, Tokyo (JP); Masanori Izumi, Zama (JP)

(73) Assignee: Nidec Tosok Corporation, Zama (JP)

( * ) Notice: Subject to any disclaimer, the term of this patent is extended or adjusted under 35 U.S.C. 154(b) by 0 days.

(21) Appl. No.: 10/048,048

(22) PCT Filed: May 23, 2001

(86) PCT No.: PCT/JP01/04323
§ 371 (c)(1),
(2), (4) Date: Jan. 23, 2002

(87) PCT Pub. No.: WO01/91174
PCT Pub. Date: Nov. 29, 2001

(65) Prior Publication Data
US 2003/0006013 A1 Jan. 9, 2003

(30) Foreign Application Priority Data
May 26, 2000 (JP) .......................... 2000-157011

(51) Int. Cl.[7] .......................... B23K 31/02; B23K 37/04
(52) U.S. Cl. .......................... 228/6.2; 228/12; 228/49.5; 228/103; 228/105; 156/379; 156/538
(58) Field of Search .......................... 228/4.1, 6.1, 6.2, 228/12, 47.1, 49.1, 49.5, 103, 105; 156/379, 538

(56) References Cited

U.S. PATENT DOCUMENTS

| 4,103,814 A | * | 8/1978 | Nishioka | 228/6.2 |
| 4,200,393 A | * | 4/1980 | Suzuki et al. | 356/73 |
| 4,799,854 A | * | 1/1989 | Niskala | 414/737 |
| 4,817,849 A | * | 4/1989 | Yamamoto et al. | 228/103 |
| 5,086,559 A | * | 2/1992 | Akatsuchi | 29/834 |
| 5,144,747 A | * | 9/1992 | Eichelberger | 29/834 |
| 5,172,468 A | * | 12/1992 | Tanaka et al. | 29/721 |
| 5,839,186 A | * | 11/1998 | Onodera | 29/720 |
| 5,854,745 A | * | 12/1998 | Muraoka et al. | 700/58 |
| 5,867,260 A | * | 2/1999 | Sakai | 356/237.3 |
| 6,168,063 B1 | * | 1/2001 | Sato et al. | 228/1.1 |
| 6,276,051 B1 | * | 8/2001 | Asai et al. | 29/740 |
| 6,317,972 B1 | * | 11/2001 | Asai et al. | 29/833 |
| 6,481,093 B1 | * | 11/2002 | Ruden et al. | 29/603.03 |

FOREIGN PATENT DOCUMENTS

| JP | 60-124945 | 7/1985 |
| JP | 61-042924 | 3/1986 |
| JP | 62-078841 | 4/1987 |
| JP | 06-283819 | 10/1994 |
| JP | 07321410 A | 12/1995 |
| JP | 2001-024007 | 1/2001 |
| JP | WO 01/91174 A1 | * 11/2001 |

OTHER PUBLICATIONS

US 2003/0006013A Kawashima et al. (Jan. 9, 2003).*

* cited by examiner

Primary Examiner—Tom Dunn
Assistant Examiner—Kiley Stoner
(74) Attorney, Agent, or Firm—Beyer, Weaver & Thomas, LLP

(57) ABSTRACT

A die bonding device for installing electronic components S on a metal stem, comprising a bonding nozzle for suctioning an electronic component S and positioning the electronic component S on a component mounting face of the stem, a stem carrying head for carrying the stem, a heater section for heating the electronic component S while it is positioned on the component mounting face of the stem, and an imaging camera having a light axis L extending through the component mounting face of the stem when positioned inside the heater section, which performs reciprocating motion in the direction of the light axis L.

7 Claims, 13 Drawing Sheets

DIE BONDING DEVICE

TECHNICAL FIELD

The present invention relates to a die bonding device used when mounting electronic components, such as semiconductor laser crystals, or the like, onto a stem.

BACKGROUND ART

In the prior art, Japanese Patent Application Laid-open No. Hei 7-321410 discloses the mounting a semiconductor laser crystal on a stem. Moreover, the operation of mounting fine components of this kind, such as semiconductor laser crystals, or the like, onto stems is performed by manual operation using tweezers, and the like, while magnifying the mounting region through use of an magnifying scope.

However, since the mounting of fine components is performed manually while looking through a magnifying scope, as described above, a great deal of the operation depends on the skill of the operator, and this is problematic in relation to improve the efficiency of the mounting operation.

SUMMARY OF THE INVENTION

The present invention is devised in order to resolve the aforementioned problems, an object thereof being to provide a die bonding device whereby automation can be achieved in installing electronic components onto stems.

The die bonding device relating to one aspect of the present invention is a die bonding device for mounting an electronic component on a metal stem, characterized in that it comprises: a bonding nozzle for suctioning the electronic component and positioning the electronic component on a component mounting face of the stem; a stem carrying head for carrying the stem; a heater section for heating while the electronic component positioned on the component mounting face of the stem to mount said electronic component on said stem; and an imaging camera having a light axis extending through the component mounting face of the stem when positioned inside the heater section, which performs reciprocating motion in the direction of the light axis.

In this die bonding device, the metal stem is suctioned by the stem carrying head and positioned (fixed) in the heater section. The electronic component suctioned to the bonding nozzle in a prescribed position is conveyed to the stem and positioned on the component mounting face. Solder material placed between the component mounting face and the electronic component is then caused to melt in the heater section, and when it subsequently solidifies, the electronic component becomes fixed to the stem, but before performing this heating inside the heater section, it is necessary to position the electronic component suctioned onto the bonding nozzle accurately on the component mounting face. Therefore, it is necessary accurately to recognize the position of the component mounting face before mounting, and for this purpose, an imaging camera is used in the present invention, but the finer the electronic component that is to be recognized, the greater the degree to which the imaging camera is required to magnify the component mounting face. Moreover, although the imaging camera performs reciprocating motion in order to avoid collision with the bonding nozzle, the deviation in the imaging position of the camera in this case has some effect on the mounting of the component. Therefore, rather than performing reciprocating motion so as to avoid the bonding nozzle to the side thereof, the imaging camera makes use of the object depth of field of the lens to perform reciprocating motion in the direction of the light axis passing through the component mounting face. Thereby, it is possible for the movement error inevitably generated when the imaging camera performs reciprocating motion mechanically to be absorbed within the object depth of field, and hence accurate imaging can be achieved using a simple composition, and particularly beneficial effects can be displayed when the predicted component mounting region is very fine, and when the imaging camera has to be moved. The light axis may intersect with the component mounting face of the stem in a perpendicular fashion, or it may intersect therewith obliquely.

Furthermore, desirably, the heater section is disposed to the side of the stem carrying head, and the stem carrying head comprises a pin insertion hole into which stem pins extending from the stem base of the stem are inserted, and rotates through 90° between a state where the pin insertion hole is facing upwards and a state where it is facing sideways. In this case, since a 90° rotatable structure is adopted for the stem carrying head, the stem pins of the stem are able to drop down from above into the pin insertion hole of the stem carrying head. The stem carrying head can then be rotated through 90° to assume a horizontal position, while the stem is mounted therein, and hence the component mounting face can be made to face towards the imaging camera.

Furthermore, desirably, the stem carrying head comprises: a stem base receiving section for supporting the circumference of the stem base of the stem, provided at the vertex portion of the stem carrying head; and a pressing hook for pressing against the circumference of the stem base of the stem, and pressing the circumference of the stem base into the stem base receiving section. If the stem carrying head performs a rotational movement or a linear advancing/withdrawing movement while the stem is mounted therein, there is a risk that the stem may become dislodged from the stem carrying head or that the position thereof may become skewed. Therefore, by holding the circumference of the stem base of the stem between a pressing hook and a stem base receiving section, any dislodging or position deviation of the stem is prevented by mechanical means.

Moreover, desirably, the front end of a position registering hook which lifts upwards towards the stem base to be positioned in the heater section enters into a notch portion provided in the circumference of the stem base of the stem. By adopting a composition of this kind, it is possible to prevent rotating of the stem while it is being carried by the stem carrying head, and by this position registering operation, the stem can be fixed and prevented from deviating in position during the imaging and heating stages.

Desirably, the electronic component is a semiconductor laser crystal; a component mounting projection is formed in the stem base of the stem; and the component mounting face extends in a direction orthogonal to the stem base, in the component mounting projection. These can be regarded as optimum components for using in the die bonding device according to the present invention.

The die bonding device according to a further aspect of the present invention is a die bonding device for fixing an electronic component onto a component mounting face of a stem, characterized in that it comprises: heating means for bonding the electronic component with the component mounting face, by means of heating; imaging means for imaging the position of the component mounting face of the stem positioned in the heating means; locating means for locating the electronic component on the component mounting face of the stem positioned in the heating means, on the basis of the positional information for the component mounting face imaged by the imaging means; and moving means for moving the imaging means along the direction of the light axis of the imaging means, to a location where it does not impede to mount the electronic component onto the component mounting face.

Accordingly, in order to move the imaging means to a position where it does not impede the placement of the electronic component onto the component mounting face, the imaging means is moved along the direction of the light axis thereof. Consequently, when capturing an image of the component mounting face of the next stem, it is not necessary to realign the imaging means with the light axis thereof. Therefore, the mounting of electronic components onto stems can be automated readily.

BEST MODE FOR CARRYING OUT THE INVENTION

Figure 1:
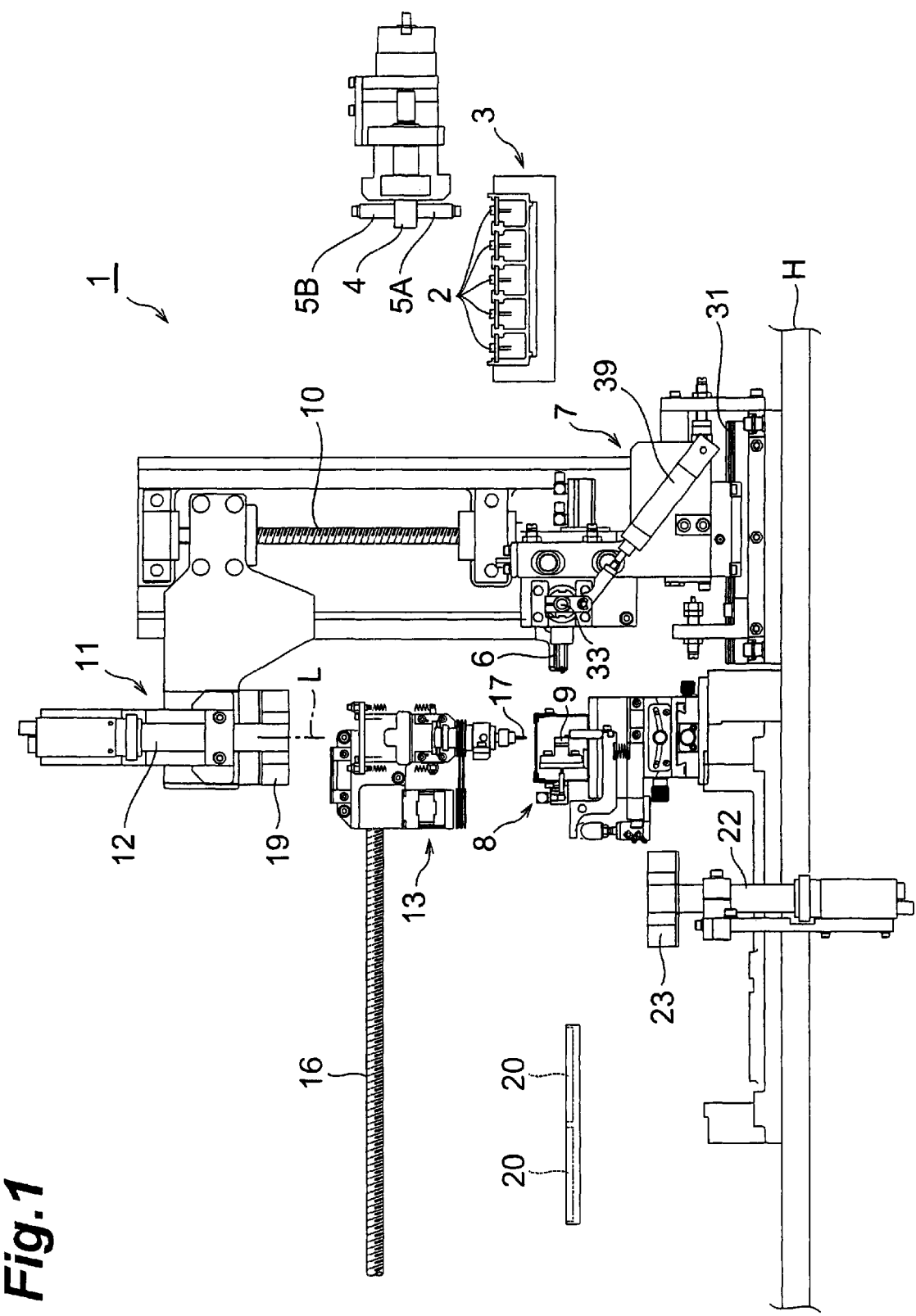
FIG. 1 is a side view showing one embodiment of a die bonding device relating to the present invention.
Figure 2:
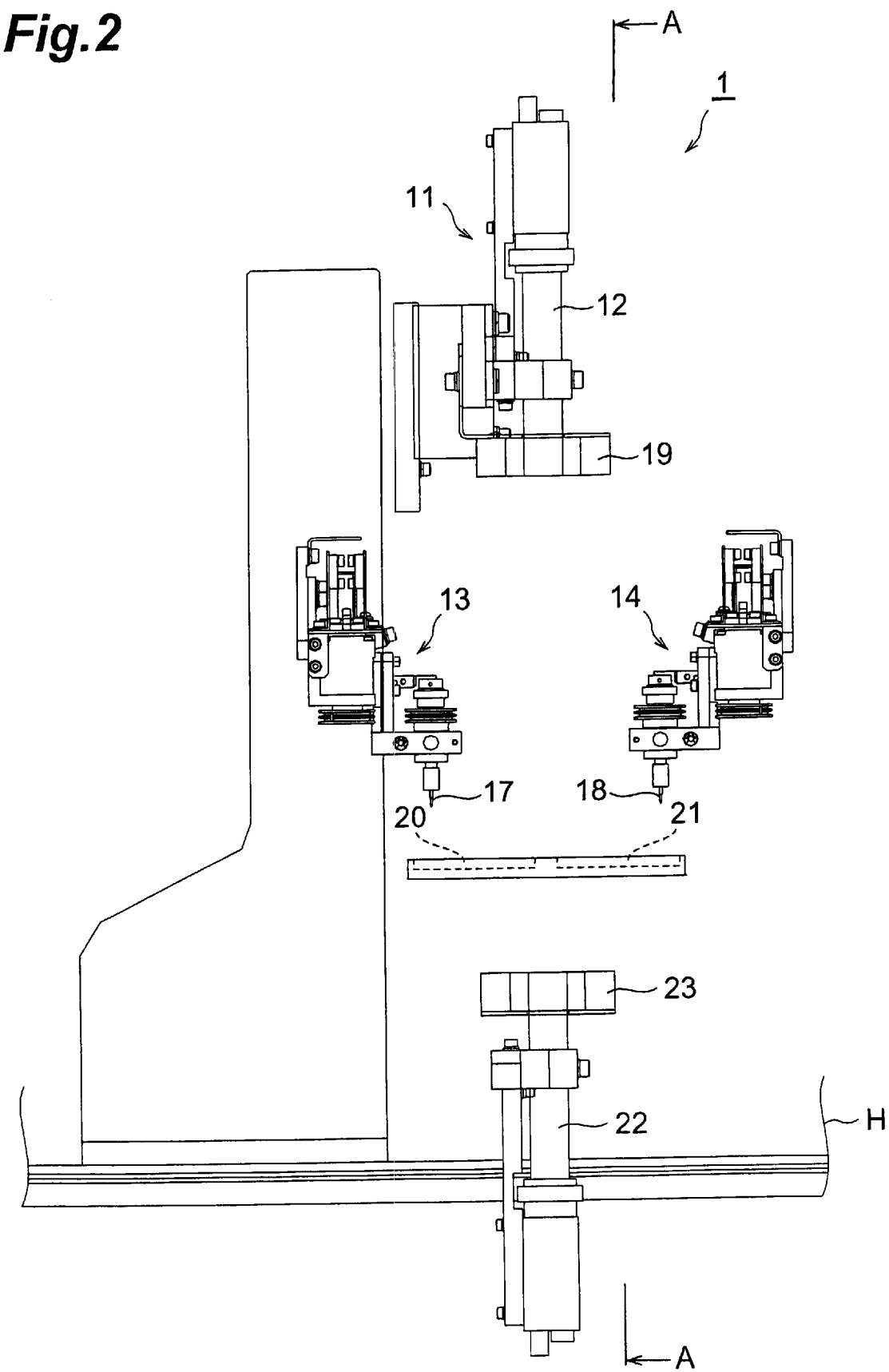
FIG. 2 is a front view of the die bonding device illustrated in FIG. 1.

Below, a preferred embodiment of a die bonding device according to the present invention is described in detail. FIG. 2 is a front view of a die bonding device 1 according to this embodiment. FIG. 1 is a side view along line A—A of the die bonding device 1 illustrated in FIG. 2. In FIG. 2, constituent elements of the die bonding device 1 illustrated in FIG. 1, such as the heater unit 8, for example, are omitted.

As shown in FIG. 1 and FIG. 2, the die bonding device 1 is a device for soldering an electronic component S at a prescribed position of a metallic stem 2, and it achieves automation of this mounting operation. The electronic component S may be, for example, a light-emitting element (for instance, a fine component such as a semiconductor laser crystal, or the like,) a photoreceptor element, or a semiconductor chip. This die bonding device 1 comprises a stacker 3 for arranging respective stems 2 in a freely suspended state, in a matrix fashion within a casing H. The stems 2 arranged by the stacker 3 are conveyed one at a time to a prescribed location, and a suction head 4 capable of movement in the front/back, up/down and left/right directions is used for this conveyance operation. Reversible rotating suction nozzles 5A, 5B are provided on the suction head 4. The suction nozzles 5A, 5B are used to convey the stems 2 to a stem carrying head 6 located in approximately the centre of the casing H (stem carrying head 6 indicated by the solid lines in FIG. 9), and then to return the stems 2 to the stacker 3 after the mounting process has been completed.

Figure 6:
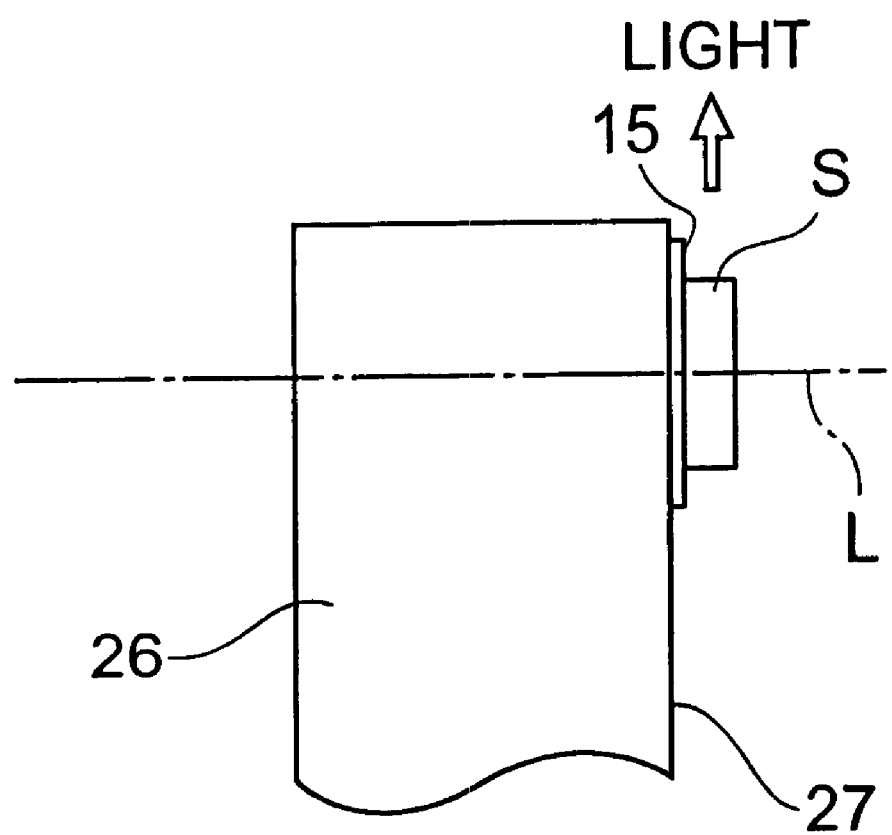
FIG. 6 is an enlarged view showing a state where a chip component has been installed on the component mounting face of a stem.

This stem carrying head 6 is provided in a stem carrying unit 7 which performs an advancing and withdrawing motion in a horizontal direction, and it is capable of rotating within a 90° range in a vertical plane. Therefore, the stem carrying head 6 is rotated between an upright state for receiving a stem 2 (stem carrying head 6 as illustrated by the solid lines in FIG. 9), and a horizontal state for heating the stem 2 (stem carrying head 6 as illustrated by the double-dotted lines in FIG. 9). Moreover, when it is in a horizontal state, the stem carrying head 6 is advanced and moved up to a heater unit 8 which opposes the stem carrying unit 7. Due to the ceramic heater section 9 provided in the heater unit 8, solder foil located between the component mounting face of the stem 2 and the electronic component S is caused to melt, whereby the electronic component S is installed onto the stem 2 (see FIG. 6). The ceramic heater section 9 is one example of heating means.

An imaging unit 11 which moves up and down by means of a feed screw mechanism 10 forming one example of moving means is positioned directly above the heater unit 8, and an imaging camera 12 comprising a combination of a magnifying lens group, and a CCD camera 12, is installed on this imaging unit 11. The imaging camera 12 is one example of imaging means. This imaging camera 12 is located in a position whereby it can view the interior of the heater section 9 from above, and it is used to magnify the fine component mounting region on the stem 2 positioned inside the heater section 9, in order that it can recognized. Therefore, when images of the component mounting region of the stem 2 are captured and processed by means of the imaging camera 12, from directly above, it is possible to determine the positional divergence between a predetermined mounting position and an actual mounting position, and the mounting position can be corrected on the basis of this value.

A light source 19 consisting of LEDs arranged in a ring fashion is installed on the front end (lower end) of the imaging camera 12. By means of this light source 19, it is possible to illuminate the region being imaged, in other words, the component mounting surface 27, described hereinafter.

Moreover, inside the casing H, there are also provided a chip bonding head 13 for conveying a semiconductor laser crystal (hereinafter, called "chip component") S to a prescribed position on the stem 2, and a solder bonding head 14 for conveying a solder foil 15 (see FIG. 6) to be inserted between the chip component S and the stem 2, to a prescribed position on the stem 2. The respective bonding heads 13, 14 have independent drive systems, and perform independent horizontal movement by means of horizontally extending feed screws 16. Moreover, respective bonding nozzles 17, 18 move up and down by means of internal mechanisms of the respective bonding heads 13, 14. The chip bonding head 13 constitutes one example of locating means. The solder foil 15 is one example of a joining member, and another example of a bonding member is thermosetting resin.

A chip tray 20 and solder tray 21 are positioned inside the movement range of these bonding heads 13, 14. The chip components S are accommodated individually inside the chip tray 20, and are extracted reliably one at a time by the bonding head 13. Similarly, the solder foils 15 are accommodated individually inside the solder tray 21, and are extracted reliably one at a time by the bonding bead 14.

Moreover, a chip recognition camera 22 for capturing an image of the suction position of the chip component S is positioned inside the casing H, and this chip recognition camera 22 is situated at an intermediate position of the conveyance path of the chip component S between the chip tray 20 and the heater unit 8. Moreover, a light source 23 consisting of LEDs arranged in a ring fashion is installed at the front end (upper end) of the chip recognition camera 22, and the portion which is being imaged can be illuminated by means of this light source 23.

Consequently, by temporarily halting the bonding nozzle 17 directly over the chip recognition camera 22, and capturing and processing an image of the chip component S from below, it is possible to deduce the positional divergence between a predetermined component suction position and an actual component suction position. In other words, the positional divergence of the chip component S with respect to the suction opening of the bonding nozzle 17 is derived by means of image processing, and the component mounting position is corrected on the basis of this value. Accurate deduction of the position for installing the chip component S onto the stem 2 is performed by means of a combination of position correction information based on the chip recognition camera 22 and the aforementioned position correction information based on the imaging camera 12.

Here, one example of a stem 2 for applying the die bonding device 1 having the aforementioned composition will be described.

Figure 3:
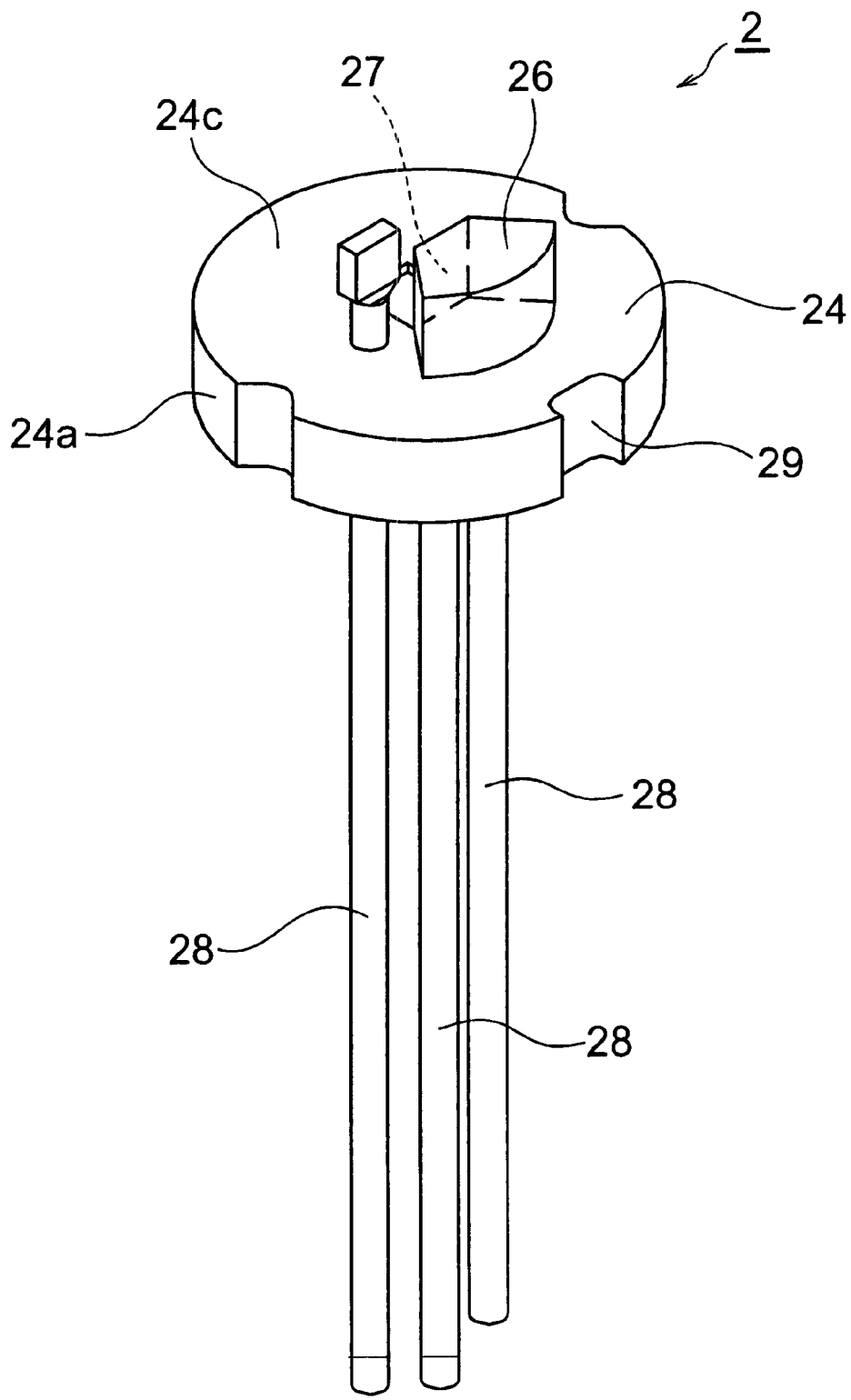
FIG. 3 is an oblique view showing a stem.
Figure 4:
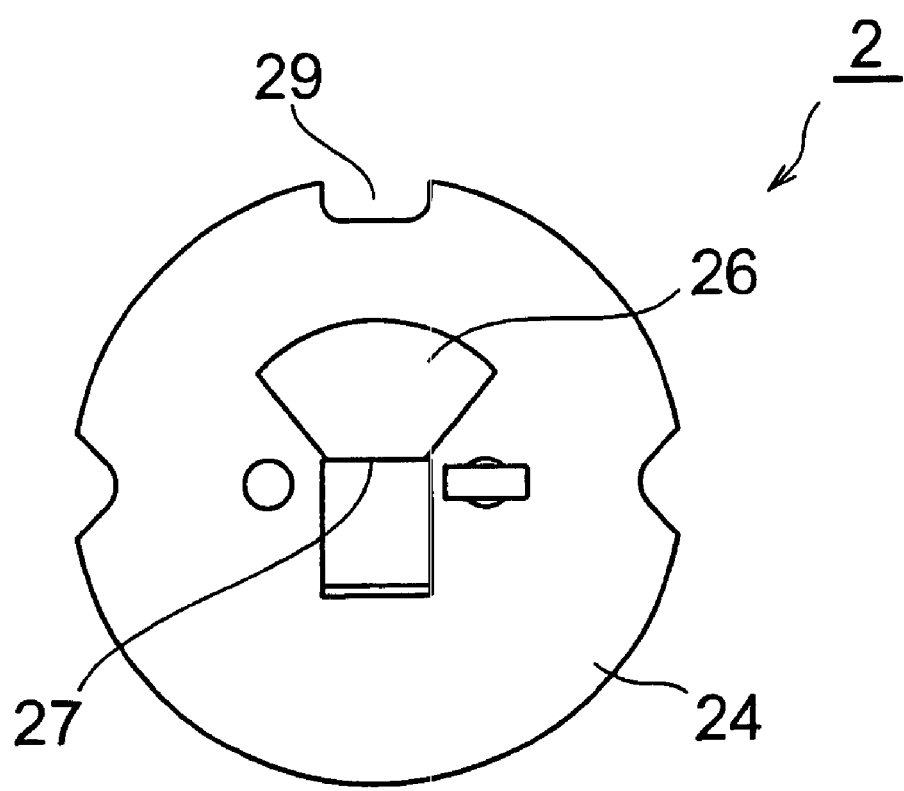
FIG. 4 is a plan view of a stem.
Figure 5:
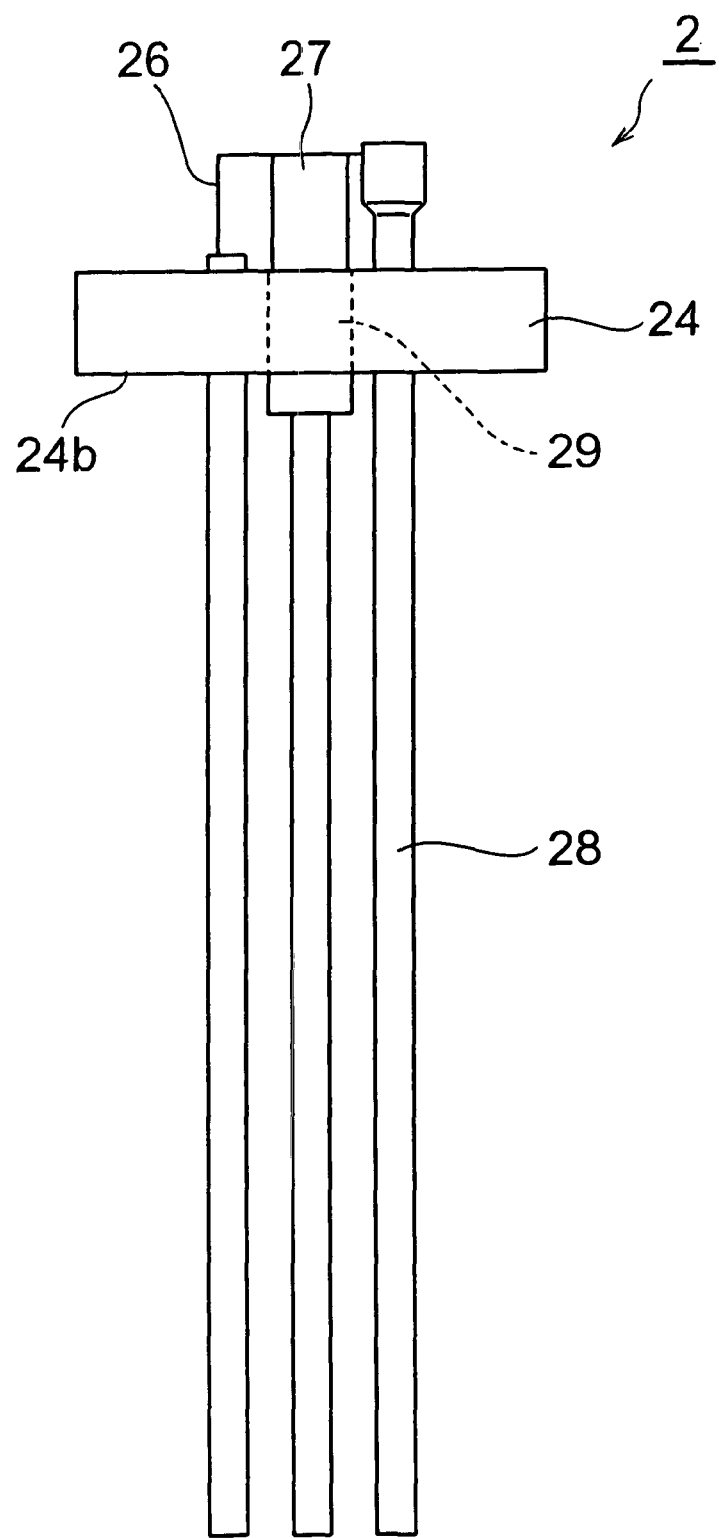
FIG. 5 is a front view of a stem.

As shown in FIGS. 3–5, the metal stem 2 has a circular disc-shaped stem base 24, onto which is formed a component mounting projection 26 directed upwards. A component mounting surface 27 extending in an orthogonal direction to the upper face 24c of the stem base 24 is provided on this component mounting projection 26, and a chip component (semiconductor laser crystal) S is bonded and installed onto this component mounting surface 27 via the solder foil 15 (see FIG. 6). Moreover, three stem pins 28 are provided projecting from the lower face of the stem base 24, an a prescribed voltage can be applied to the chip component S via prescribed stem pins 28. On the cylindrical face 24a of the stem base 24, a notch portion 29 for positioning is provided to the rear of the component mounting projection 26.

Figure 7:
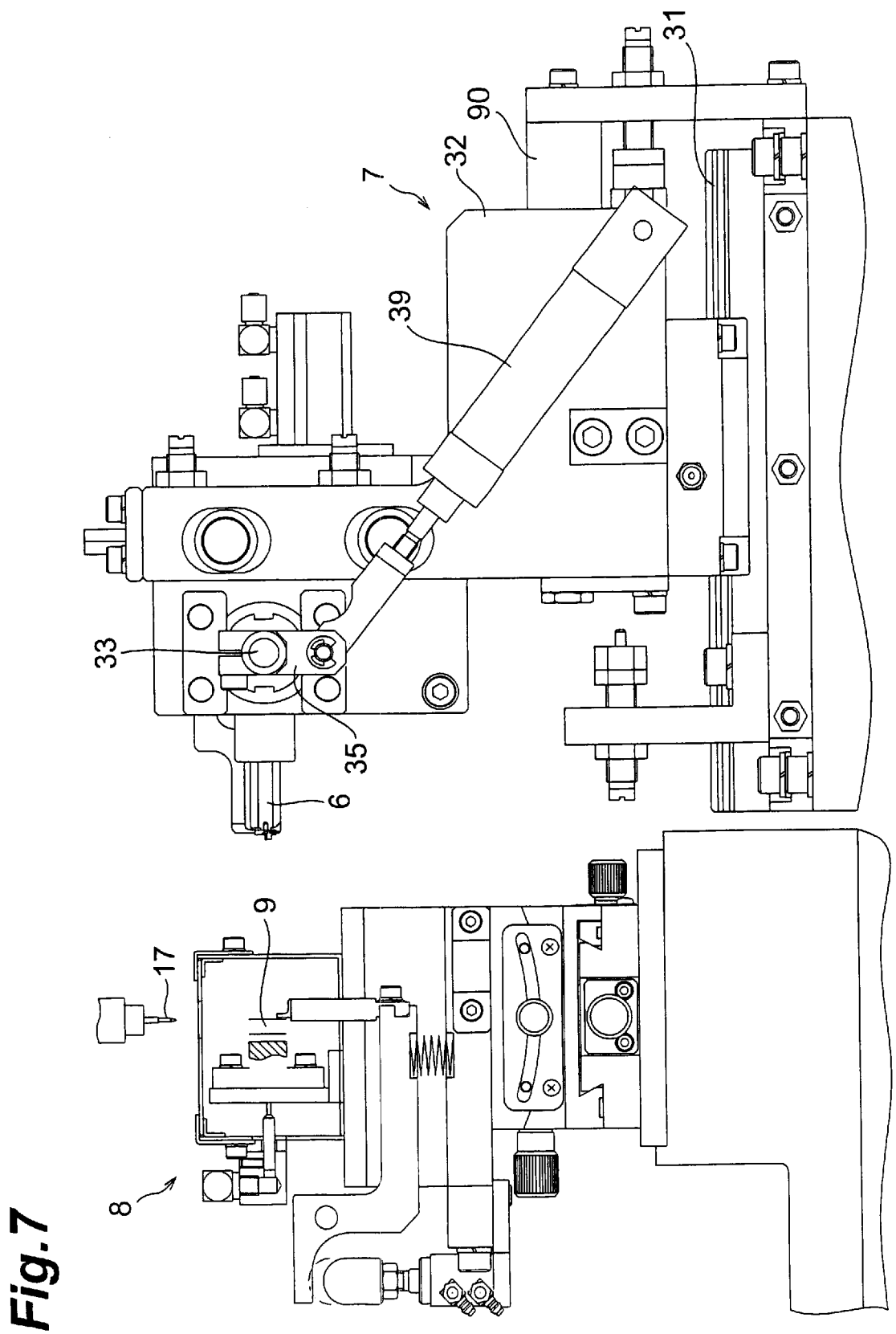
FIG. 7 is a principal enlarged view of the die bonding device illustrated in FIG. 1.
Figure 8:
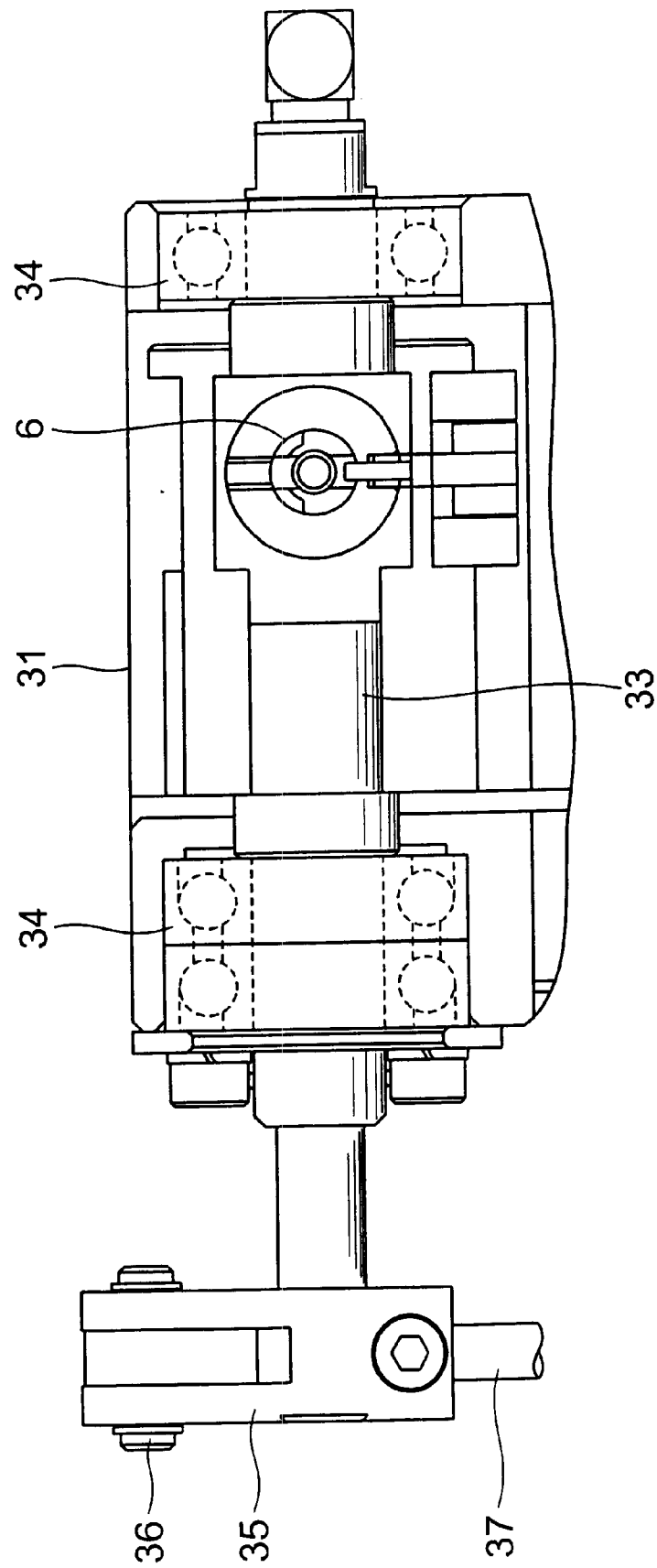
FIG. 8 is a plan view showing the circuit composition of a stem carrying head.

Next, the aforementioned stem carrying unit 7 will be described in detail. As illustrated in FIG. 7, this stem carrying unit 7 comprises a movable block 32 which advances and withdraws in the horizontal direction along a guide rail 31, by means of an air cylinder 90, and the stem carrying head 6 is installed rotatably on this movable block 32. The stem carrying head 6 is fixed to a rotating shaft 33 extending in the horizontal direction, as illustrated in FIG. 8 and FIG. 9, and the rotational shaft 33 is held in a double-supported state by bearings 34 provided in the movable block 32.

Moreover, one end of a link 35 is fixed to one end of the rotational shaft 33, and the other end of this link 35 is coupled via an axle pin 36 to a piston rod 37 of an air cylinder mechanism 39. Furthermore, since the air cylinder mechanism 39 must be capable of performing a swinging motion, the end of the air cylinder mechanism 39 is installed rotatably on the movable block 32, via the axle section 38.

Figure 9:
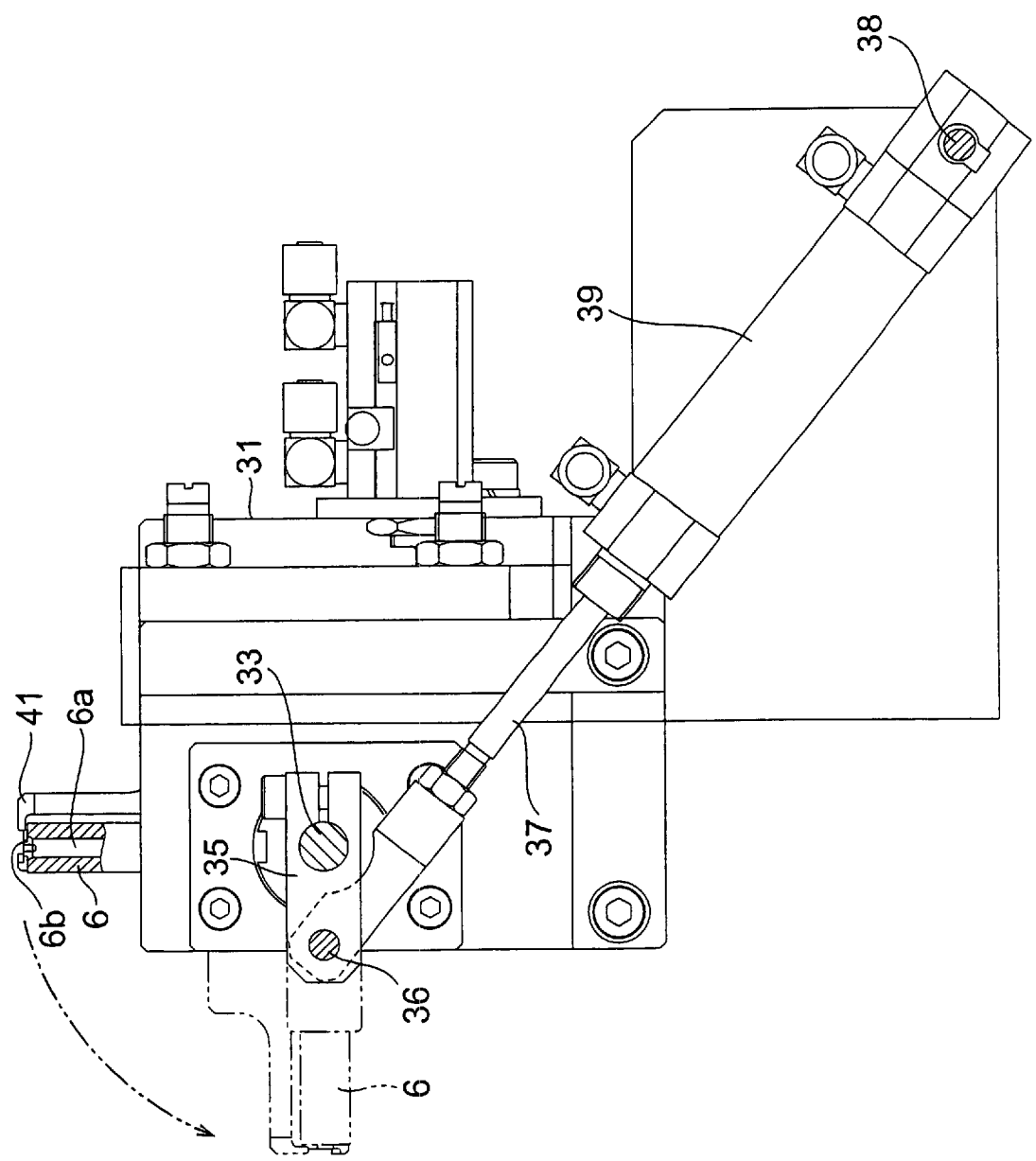
FIG. 9 is a side view showing the circuit composition of a stem carrying head.

Consequently, by causing the piston rod 37 to extend, it is possible to set the stem carrying head 6 to an upright state, as illustrated in FIG. 9, and by causing the piston rod 37 to withdraw, it is possible to set the stem carrying head 6 to a horizontal position, thereby making the stem base 24 of the stem 2 oppose the heater section 9.

In this way, the stem carrying head 6 rotates through a range of 90° within a vertical plane, between a state where it is stood upright in order to receive the stem pins 28 of a stem 2, and a state where it is laid horizontally in order to heat the component mounting projection 26 of the stem 2. Thereby, when the stem carrying head 6 is in an upright state, an opening 6b of a pin insertion hole 6a of the stem carrying head 6 (see FIG. 9) assumes an upward-facing state, whereby the stem pins 28 can readily drop down into the pin insertion hole 6a from above.

On the other hand, if the stem carrying head 6 is in a horizontal position, the opening 6b faces to the side, and the component mounting face 27 of the stem 2 is oriented upwards, whereby it is possible to install a chip component S onto the component mounting face 27, from above. Moreover, since the stem carrying head 6 is advanced together with the movable block 32, it is possible for the component mounting projection 26 to be inserted inside the heater section 9, when the component mounting face 27 is oriented upwards.

Figure 10:
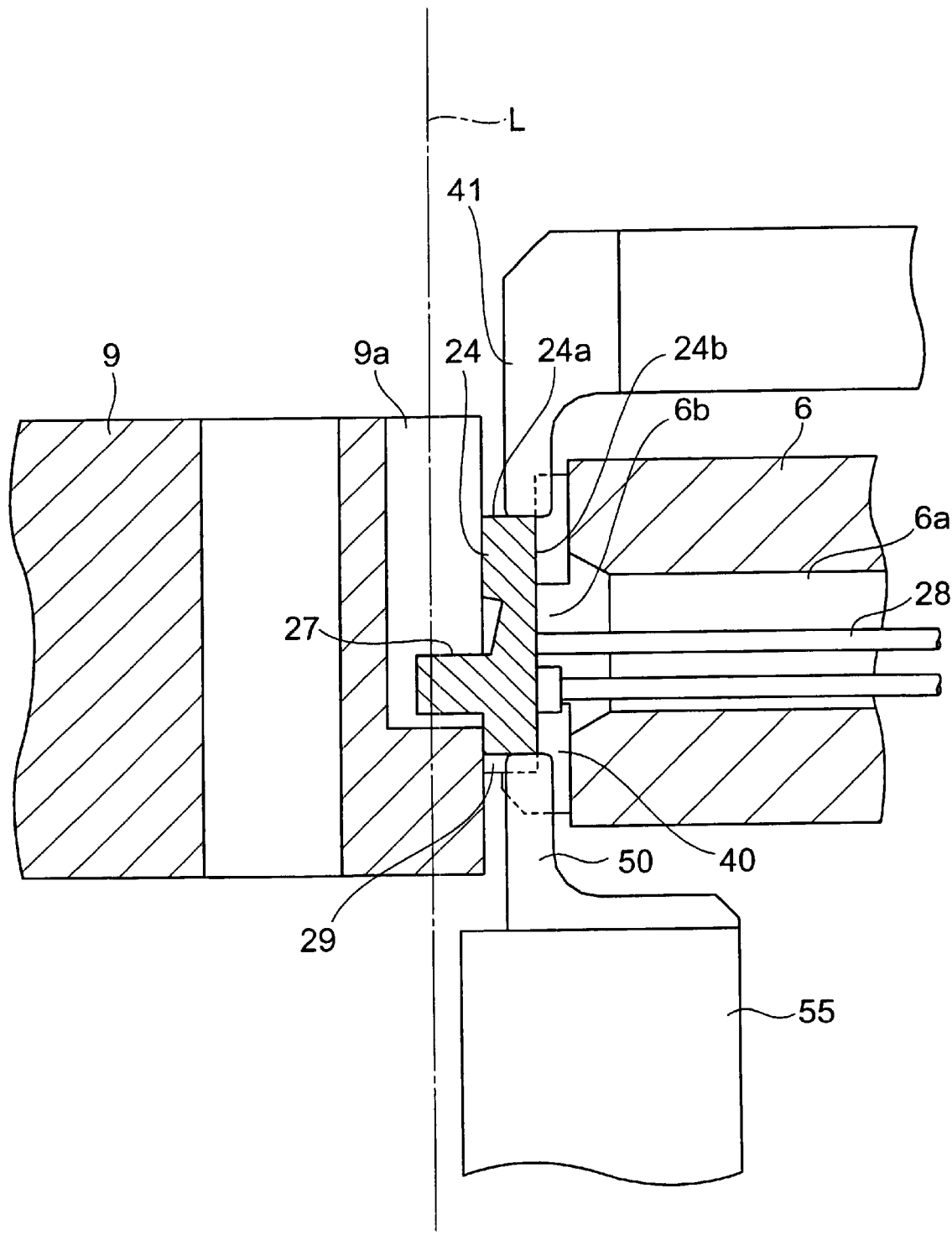
FIG. 10 is a sectional view showing the state of a stem component mounting face positioned inside a heater section.
Figure 11:
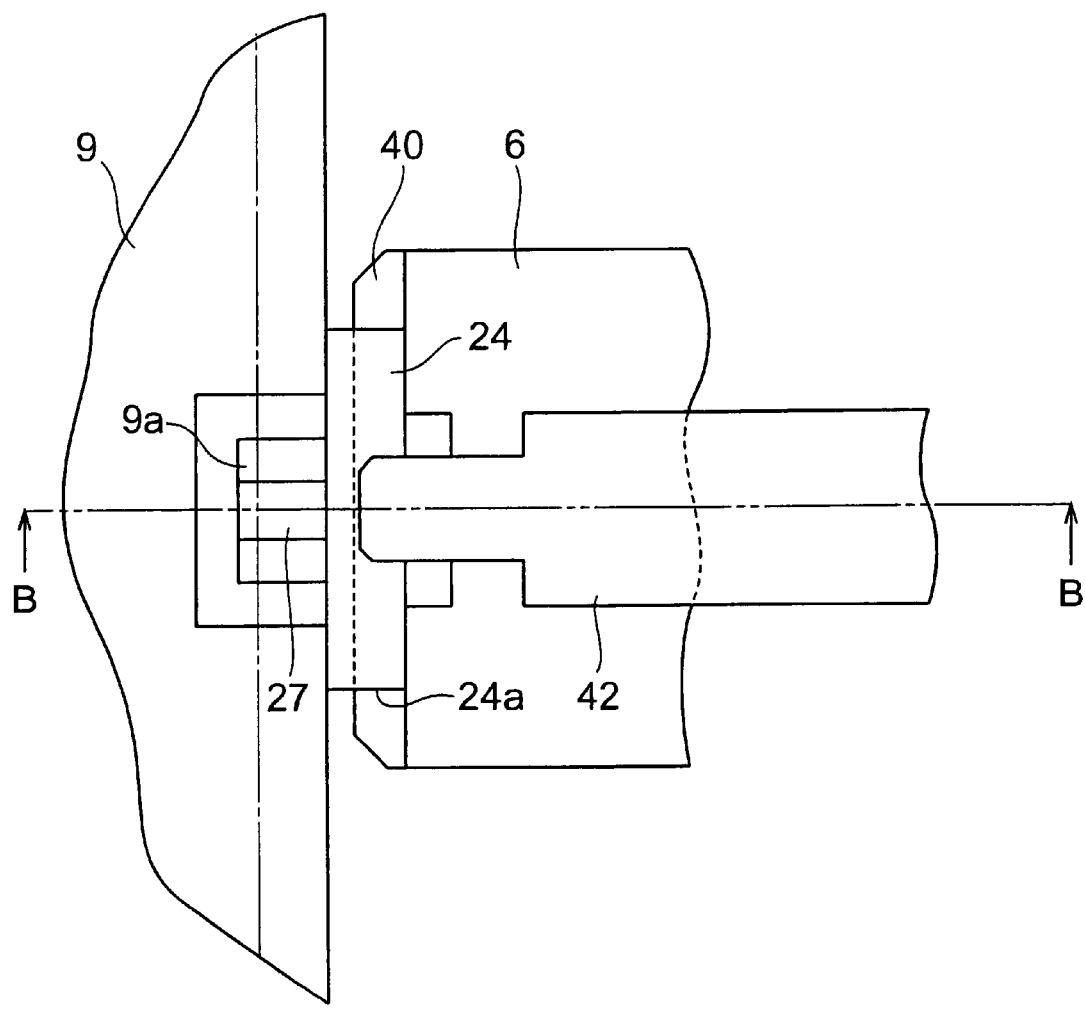
FIG. 11 is a plan view of a FIG. 10.

Furthermore, since the stem carrying head 6 performs 90° rotational movement and linear advancing and withdrawing movement, there is a risk that the stem 2 may become dislodged from the stem carrying head 6, or its position may become skewed. Therefore, as shown by FIG. 11 and FIG. 10 which is a sectional view taken along arrows B—B in FIG. 11, a stem base receiving section 40 projects from the vertex section of the stem carrying head 6, and the under face 24b of the stem base 24 is held by the stem base receiving section 40 when the stem pins 28 of the stem 2 are inserted inside the pin insertion hole 6a. Furthermore, the front end of a pressing hook 41 is pressed against the circumference 24a of the stem base 24, from the side thereof opposing the stem base receiving section 40.

Figure 12:
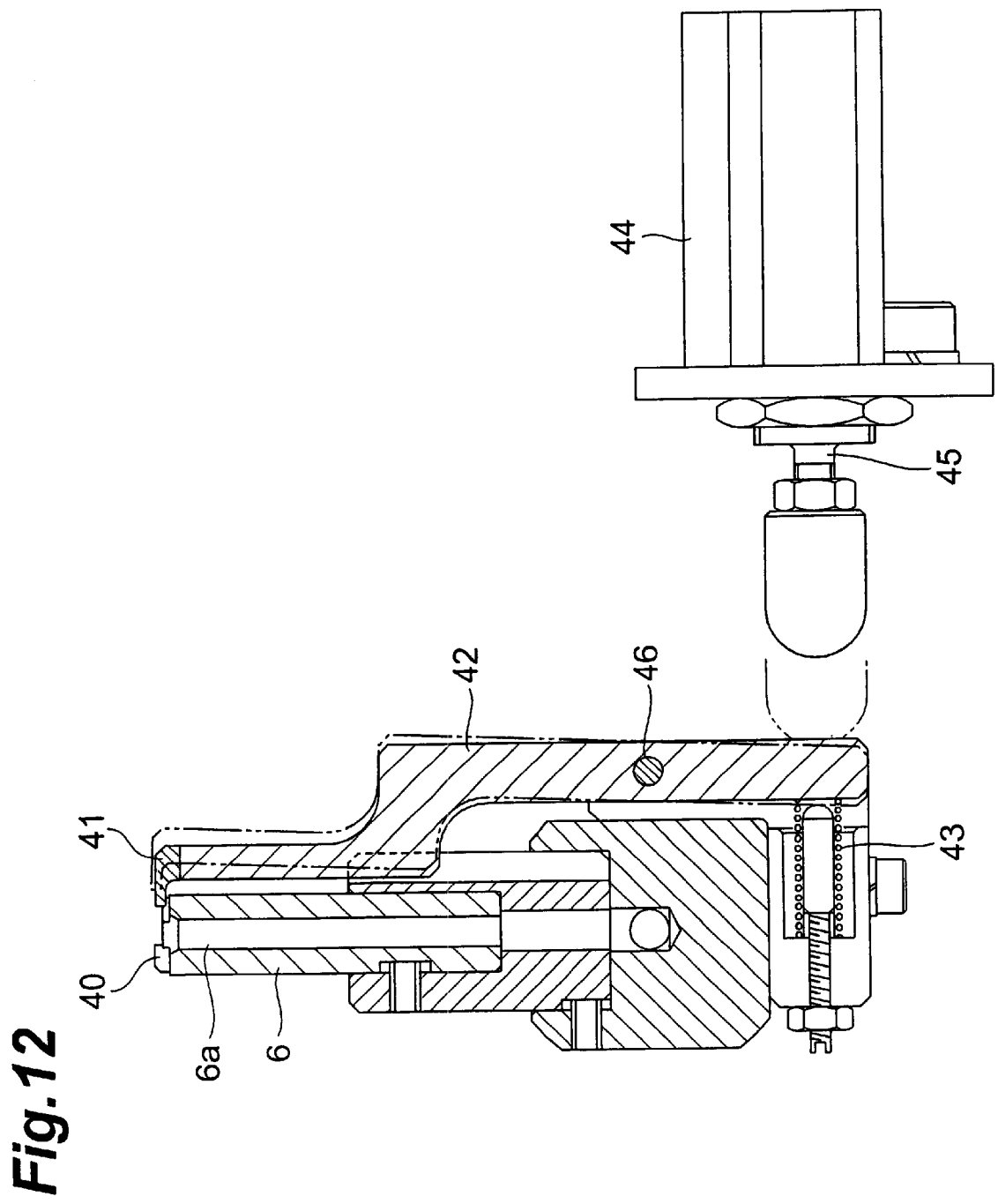
FIG. 12 is a sectional view showing the operational mechanism of a pressing hook.

As shown in FIG. 12, this pressing hook 41 is provided on the front end of a swinging lever 42 which extends along the stem carrying head 6. This swinging lever 42 is supported swingably by an axle section 46 provided on the stem carrying head 6, and the base end of the swinging lever 42 is pressed by a spring 43. Consequently, under the pressing force of the spring 43, the pressing hook 41 is pressed against the circumference 24a of the stem base 24, whereby the circumference 24a of the stem base 24 is held between the front end of the pressing hook 41 and the stem base receiving section 40, and hence any dislodging or positional deviation of the stem 2 can be avoided by using mechanical means.

Furthermore, the pressing force of the pressing hook 41 can be released by means of a piston rod 45 of an air cylinder mechanism 44 provided on the stem carrying unit 7. In other words, by means of an extending operation of the piston rod 45, the front end of the piston rod 45 is pressed against the base end of the swinging lever 42 against the force of the spring 43, and as a result, the pressing hook 41 is disengaged in an outward direction. This pressure disengagement operation is used immediately before mounting a stem 2 in the stem carrying head 6, and while removing the stem 2 from the stem carrying head 6, after completing component mounting.

It is also possible to press the under face 24b of the stem base 2 against the stem base receiving section 40, by creating a vacuum via the pin insertion hole 6a provided in the stem carrying head 6, and hence dislodging or positional deviation of the stem 2 can also be prevented by physical means, and not only mechanical means as described above.

Figure 13:
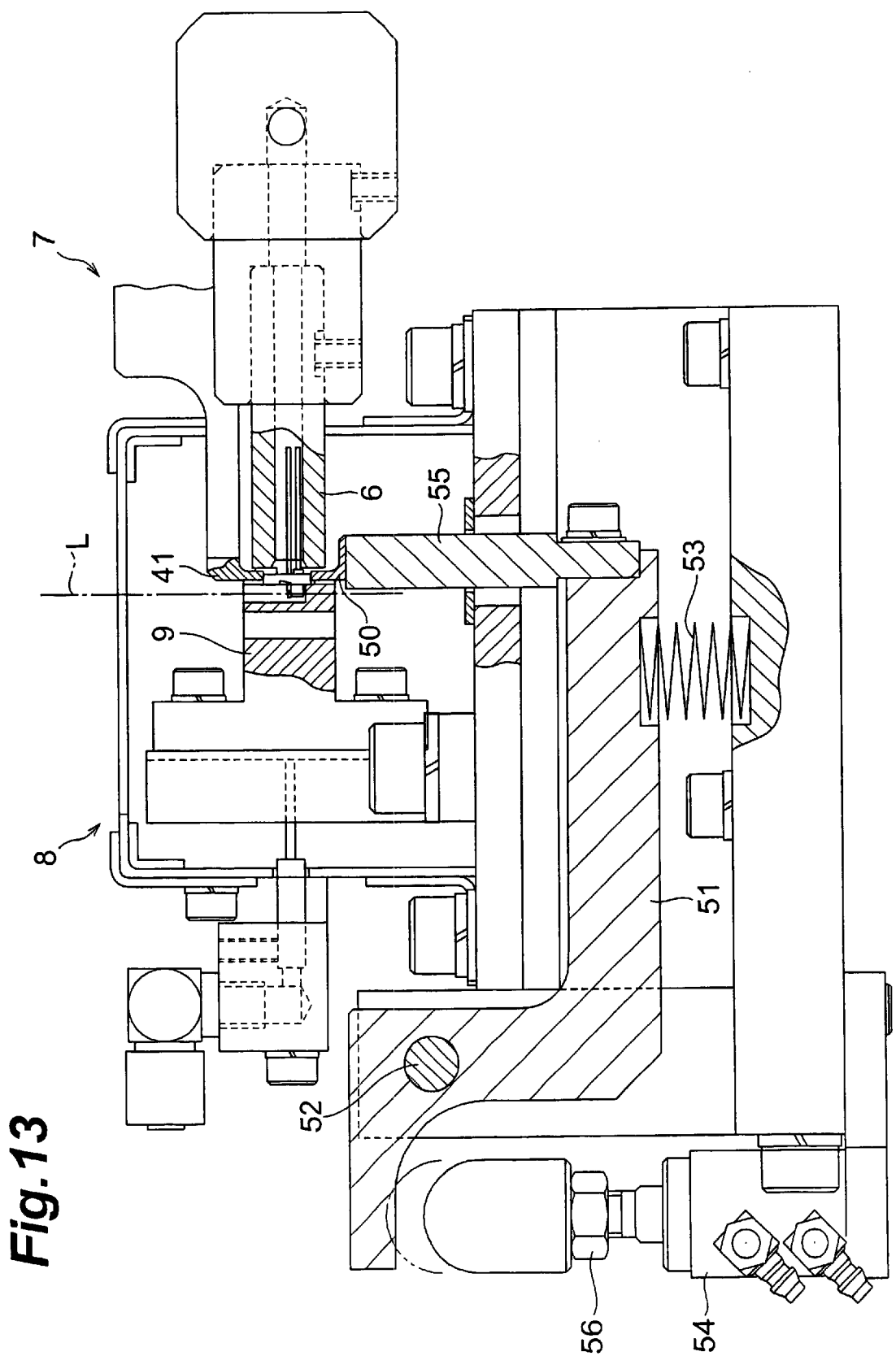
FIG. 13 is a sectional view showing the operational mechanism of a position registering hook.

As illustrated in FIG. 10 and FIG. 13, during imaging or heating, if the component mounting face 27 is positioned inside the recess section 9a formed in the front face of the heater section 9, then it is necessary to prevent turning of the stem 2, in order that the component mounting face 27 faces upwards at all times. Therefore, a position registering hook 50 projects downwards towards to the stem base 24, in such a manner that that the position registering hook 50 is inserted into the notch portion 29 provided on the circumference 24a of the stem base 24. This position registering hook 50 is fixed to the front end of a raising and lowering member 55 extending in the vertical direction, and this raising and lowering member 55 is fixed to the front end of a horizontally extending swinging arm 51.

Furthermore, the swinging arm 51 is supported swingably by an axle section 52 provided on the heater unit 8, and it is also supported by a spring 53 located therebelow, in such a manner that it projects upwards from below. Consequently, the position registering hook 50 is inserted inside the notch portion 29 of the stem base 24 by means of the pressing force of the spring 53.

On the other hand, the positional registration performed by the position registering hook 50 can be released by means of a piston rod 56 of an air cylinder mechanism 54 positioned on the base end side of the swinging arm 51. In other words, by means of an extending operation of the piston rod 56, the front end of the piston rod 56 is pressed against the base end of the swinging arm 51, from below, against the force of the spring 53, and as a result, the position registering hook 50 is disengaged in a downward direction. This operation of disengaging the positional registration is performed after completion of the heating/cooling operation of the stem 2.

As illustrated in FIG. 10, the positional registration of the component mounting face 27 performed inside the heater section 9 is implemented at a position where the light axis L of the imaging camera 12 passes through the centre of the predicted mounting region for the chip component S. When the fine predicted mounting position of the chip component S is to be identified, it is necessary to enlarge the component mounting face 27 to a large factor of magnification, by means of the imaging camera 12. In this case, the imaging camera 12 performs reciprocating motion in the upward/downward directions, in order to avoid collision with the bonding heads 13, 14. The imaging camera 12 utilizes the depth of field of the lens to move reciprocally along the light axis L passing through the component mounting face 27. Therefore, the imaging camera 12 is able to absorb within its depth of field the movement differential caused inevitably when it performs reciprocating motion mechanically by means of the feed screw mechanism 10, and the like, and hence accurate imaging is achieved by means of a simple composition, and notable benefits can be achieved even when the predicted component mounting region is very small, or when the imaging camera 12 is inevitably moved.

Next, the operation based on the aforementioned composition of the die bonding device 1 is described in simple terms.

Firstly, as shown in FIGS. 1 and 2, the stem bases 24 of stems 2 selected from a plurality of stems 2 aligned in a suspended state in a stacker 3 are suctioned one by one, respectively, by a suction nozzle 5A and suction nozzle 5B.

In this state, the suction head 4 is advanced and the suction head 4 is then halted in such a manner that that the suction nozzles 5A, 5B are situated directly over the stem carrying head 6. Thereupon, the suction nozzle 5A is lowered and the stem pins 28 of the stem 2 are inserted inside the pin insertion hole 6a of the stem carrying head 6 in an upright state. After reducing the interior of the pin insertion hole 6a to a vacuum state, the stem base 24 is inserted between the stem base receiving section 40 and the pressing hook 41, while the pressing hook 41 is pressed against the circumference 24a of the stem base 24.

The stem carrying head 6 is turned through 90° from this state to assume a horizontal position, whereby the component mounting face 27 is caused to face directly upwards. Thereupon, the movable block 32 is advanced, and the component mounting projection 26 of the stem 2 is inserted into the recess section 9a of the heater section 9. The position registering hook 50 is caused to project upwards and the position registering hook 50 is inserted inside the notch portion 29 of the stem base 24, thereby registering the position of the stem 2. In this case, the component mounting face 27 is magnified by the imaging camera 12, an image of the component mounting region of the stem 2 is captured from directly above, and image processing is implemented to deduce positional deviation between the predicted mounting position and the current mounting position. In other words, after registering the position of the stem 2, the imaging camera 12 is advanced by the feed screw mechanism 10 in the direction of the optical axis L of the imaging camera 12 (FIG. 10). The imaging camera 12 then captures an image of the position of the component mounting face 27 of the stem 2 which has been located within the recess 9a of the heater section 9. On the basis of this position information, the chip component S is positioned on the component mounting face 27 of the stem 2 by means of the chip bonding head 13, as described hereinafter.

After image processing has been completed, the imaging camera 12 is retracted by the feed screw mechanism 10 in the direction of the light axis L, so that the imaging camera 12 is moved to a position where it does not impede the placement of the solder foil 15 onto the component mounting face 27. This movement may also be achieved by moving the imaging camera 12 in the direction of the light axis L to a position where it does not impede the placement of the chip component S onto the component mounting face 27. Solder foil 15 in the solder tray 21 is sucked up onto the bonding nozzle 1B, conveyed in this state to a position over the stem base 24, and laid in position over the component mounting face 27. Thereupon, a chip component S in the chip tray 20 is sucked up by the bonding nozzle 17 and at an intermediate stage of its conveyance to a position over the stem base 24, it is temporarily halted directly over the chip recognition camera 22. The position at which the chip component S is held by the bonding nozzle 17 is imaged by the chip recognition camera 22. The chip recognition camera 22 then performs image processing to deduce the positional deviation between the expected component suction position and the actual component suction position, in the suction hole of the bonding nozzle 17. By using a combination of positional correction information from the chip recognition camera 22 and positional correction information from the imaging camera 12, the bonding nozzle 17 is controlled so that the chip component S is positioned accurately on the component mounting face 27. In other words, the chip bonding head 13 positions the chip component S on the component mounting face 27 of the stem 2 positioned in the recess section 9a of the heater section 9, on the basis of information for the position at which the chip component S is held as captured by the chip recognition camera 22, and the information for the position of the component mounting face 27 as captured by the imaging camera 12.

Thereupon, by heating the ceramic heater section 9 to approximately 350° C., for example, the solder foil 15 between the chip component S and the component mounting face 27 is caused to melt. Next, the power of the heater is turned off, and nitrogen gas is caused to flow into the heater section 9, whereby the heater section 9 is rapidly cooled, thereby cooling the solder foil 15, causing the solder foil 15 to harden, and hence the chip component S becomes installed on the component mounting face 27. In this case, the stem base 24 is also cooled by blowing nitrogen gas from the pin insertion hole 6a of the stem carrying head 6.

After the component mounting process of this kind has been completed, the movable block 32 is withdrawn by the air cylinder 90, the stem carrying head 6 is rotated 90° to an upright position, and the stem 2 is released from the stem carrying head 6, in such a manner that the pressing hook 41 disengages in an outward direction. Thereupon, the stem 2 having completed mounting is lifted up by the suction nozzle 5A. This stem 2 is conveyed to the stacker 3 and returned to its original position, whereupon the series of component mounting steps is completed.

Here, after removing a stem 2 from the stem carrying head 6 by means of the suction nozzle 5A, the suction head 4 is rotated through 180° in order to mount a stem 2 on which no component has been installed in the now vacant stem carrying head 6. Thereby, the suction nozzle 5B is turned downward, and in this state, the stem pins 28 of the fall down inside the pin insertion hole 6a of the stem carrying head 6. In this way, by adopting a rotational-type suction head 4, it is possible to mount a further stem 2 in the stem carrying head 6 by means of a suction nozzle 5B, immediately after a stem 2 having completed component mounting has been removed by suction nozzle 5A, and hence preparation for the next component mounting operation can be completed in a short period of time, and an efficient component mounting operation can be achieved.

The die bonding device according to the present invention is not limited to the aforementioned embodiment, and, for example, a heat sink may be positioned between the chip component S and the mounting surface 27, by using the aforementioned bonding nozzle 18.

INDUSTRIAL APPLICABILITY

According to the present invention, it is possible to achieve automation in the mounting of electronic components onto stems.

What is claimed is:

1. A die bonding device for mounting an electronic component on a metal stem, characterized by
   a bonding nozzle for suctioning said electronic component and positioning said electronic component on a component mounting face of said stem;
   a stem carrying head for carrying said stem;
   a heater section for heating while said electronic component positioned on said component mounting face of said stem to mount said electronic component on said stem; and
   an imaging camera having a light axis extending through said component mounting face of said stem when positioned inside said heater section, which performs reciprocating motion in the direction of said light axis.

2. The die bonding device according to claim 1, characterized in that said heater section is disposed to the side of said stem carrying head, and said stem carrying head comprises a pin insertion hole into which stem pins extending from the stem base of said stem are inserted, and rotates through 90° between a state where said pin insertion hole is facing upwards and a state where it is facing sideways.

3. The die bonding dvice according to claim 1, characterized in that said stem carrying head comprises: a stem base receiving section for supporting the circumference of said stem base of said stem, provided at the vertex portion of said stem carrying head; and a pressing hook for pressing against the circumference of said stem base of said stem, and pressing said circumference of said stem base onto said stem base receiving section.

4. The die bonding device according to claim 1, characterized in that the front end of positing registering hook which lifts upwards towards said stem base to be positioned in said heater section enters into a notch portion provided in the circumference of said stem base of said stem.

5. The die bonding device according to claim 1, characterized in that said electronic component is a semiconductor laser crystal; a component mounting projection is formed in said stem base of said stem; and said component mounting face extends in a direction orthogonal to said stem base, in said component mounting projection.

6. A die bonding device for fixing an electronic component onto a component mounting face of a stem, characterized by
   heating means for bonding said electronic component with said component mounting face, by means of heating;
   imaging means for imaging the position of said component mounting face of said stem positioned in position in said heating means;
   locating means for locating said electronic component on said component mounting face of said stem positioned in said heating means, on the basis of the positional information for said component mounting face imaged by said imaging means; and
   moving means for moving said imaging means along the direction of the light axis of said imaging means, to a location where the moving means does not impede to mount of said electronic component onto said component mounting face.

7. The die bonding device according to claim 6, characterized by further comprising a stem carrying head for carrying said stem, and said stem carried by said stem carrying head is positioned in position in said heating means.

* * * * *